United States Patent [19]
Izadian

[11] Patent Number: 5,329,248
[45] Date of Patent: Jul. 12, 1994

[54] POWER DIVIDER/COMBINER HAVING WIDE-ANGLE MICROWAVE LENSES

[75] Inventor: Jamaledin Izadian, San Jose, Calif.

[73] Assignee: Loral Aerospace Corp., New York, N.Y.

[21] Appl. No.: 965,178

[22] Filed: Oct. 23, 1992

Related U.S. Application Data

[63] Continuation-in-part of Ser. No. 806,083, Dec. 11, 1991, abandoned.

[51] Int. Cl.⁵ .............................................. H03F 3/68
[52] U.S. Cl. ................................... 330/295; 330/286; 330/54
[58] Field of Search .................. 330/295, 286, 54; 333/128, 125, 137; 343/754

[56] References Cited

U.S. PATENT DOCUMENTS

| | | | |
|---|---|---|---|
| 4,381,509 | 4/1983 | Rotman et al. | 343/754 |
| 4,588,962 | 5/1986 | Saito et al. | 330/295 |
| 4,736,463 | 4/1988 | Chavez | 359/276 |
| 5,128,687 | 7/1992 | Fay | 343/754 |

OTHER PUBLICATIONS

Wide Angle Microwave Lens for Line Source Applications, Rotman et al., IEEE Transactions on Antennas and Propagation, Nov. 1966, pp. 23-31.

Primary Examiner—Robert J. Pascal
Assistant Examiner—Tan Dinh
Attorney, Agent, or Firm—Greg T. Sueoka; Edward J. Radlo; Amir H. Raubvogel

[57] ABSTRACT

A microwave power divider/combiner (10) comprises a preamplifier (12), a first microwave lens (14), a plurality of amplifiers (16), and a second microwave lens (18). The preamplifier (12) is coupled to receive a microwave source signal (20) and amplify it. The output of the preamplifier (12) feeds the first lens (14). The first lens (14) divides the signal received on its input into a plurality of signals of equal amplitude and phase. Each output of the first lens (14) is then provided to an input of a respective amplifier (16) from the plurality of amplifiers (16). The amplifiers (16) amplify the divided signals and output them to the second lens (18). The second lens (18) has a plurality of inputs and recombines the signals on the inputs into a single higher level signal at an output (22). The present invention also provides a compact configuration for the divider/combiner (10) of the present invention with the lenses (14, 18) mounted on top of each other separated by a mounting block (26). The amplifiers (16) are mounted on a side of the mounting block (26) proximate the output of the first lens (14) and the input on the second lens (18), between the first and second lenses (14, 18) to reduce coupling losses.

21 Claims, 7 Drawing Sheets

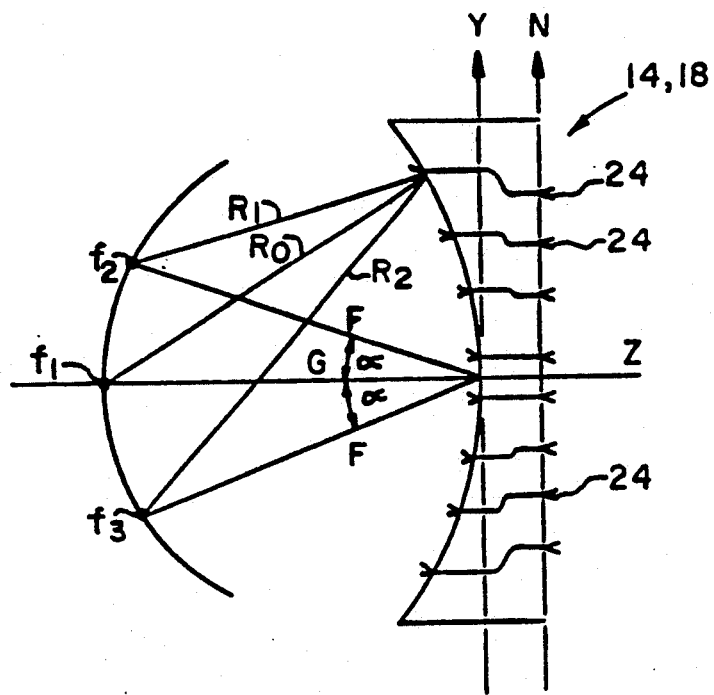
FIGURE.3
FIGURE.4
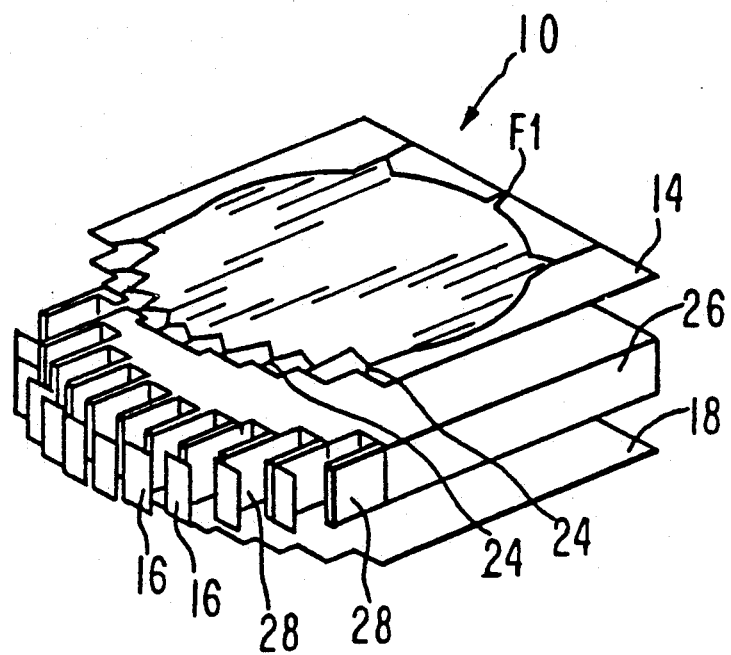

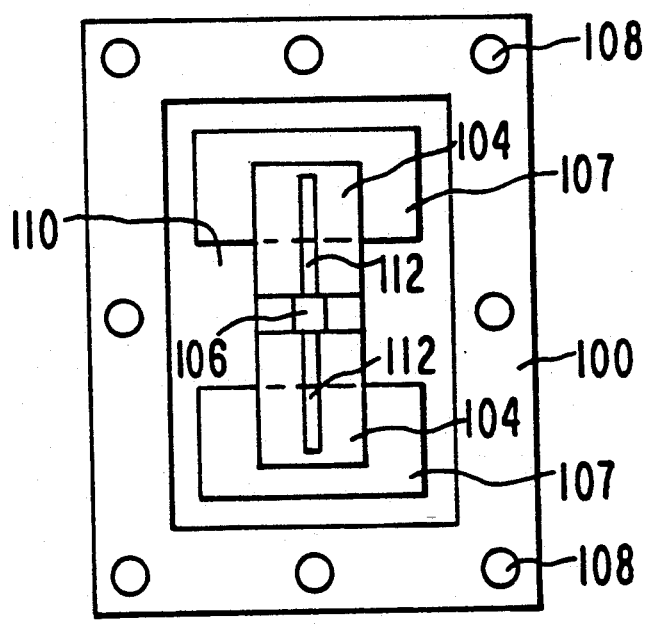
FIGURE.IIA
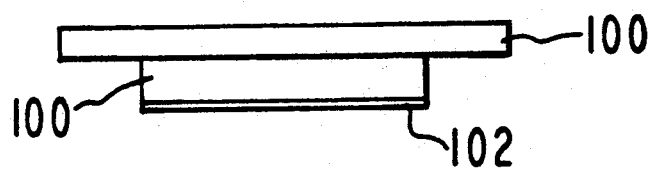
FIGURE.IIB
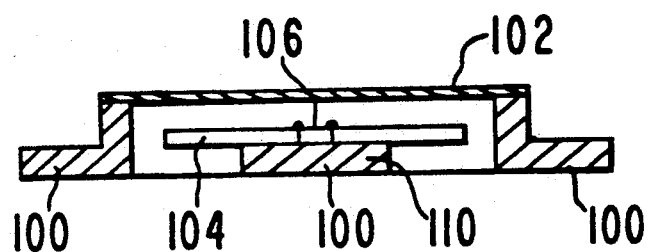
FIGURE.IIC

POWER DIVIDER/COMBINER HAVING WIDE-ANGLE MICROWAVE LENSES

CROSS-REFERENCE TO RELATED APPLICATIONS

This application is a continuation-in-part of U.S. Patent application, Serial No. 07/806,083, filed on Dec. 11, 1991, and now abandoned.

BACKGROUND OF THE INVENTION

1. Field of the Invention

The present invention relates to an apparatus and method for dividing and combining electromagnetic energy. In particular, the present invention relates to an apparatus and method for dividing, amplifying and combining a high power microwave source using a wide-angle lens.

2. Description of Related Art

Satellite communication systems require high levels of microwave energy to provide for high data rates and error free reception of signals. Traditionally, equipment capable of providing such high energy levels of microwave power is very expensive, requires excessive amounts of power and compartment space, and has a short service life. Moreover, these problems are aggravated as the output power levels are increased.

The prior art has attempted to resolve these shortcomings and provide high energy microwave signals using solid state power devices. To provide the high power required in satellite communications, the prior art has attempted to combine several solid state devices to cause their power output to be combined, because solid state power devices are inherently low power. The summing of individual energy levels simulates a single higher level energy source.

U.S. Pat. No. 4,835,496, issued to Schellenberg et al., discloses a power divider/combiner circuit fabricated in a planar integrated circuit. The source signal is divided, each of the divided signals is amplified, and the amplified signals are recombined. The device uses a microstrip line that branches out into high impedance lines. The lines are converted using a step transformer and isolation resistors placed between lines to dampen unwanted modes. With the device of Schellenberg, equal amplitude and phase are difficult to obtain in dividing and combining the microwave signal. Therefore, the device of Schellenberg is not fully successful in combining the individual small power sources into a single higher level energy source.

U.S. Pat. No. 4,588,962, issued to Saito et al., discloses a waveguide power divider/combiner that uses a dielectric lens for making the phase and magnitude of the microwave signal uniform. The device of Saito uses a waveguide and a sectoral horn to distribute the electromagnetic energy. The energy is then coupled to microstrip line by means of electromagnetic induction. The device of Saito requires the careful design of electromagnetic coupling mechanisms to the microstrip, which makes the divider/combiner of Saito very complex and difficult to manufacture. The device of Saito also requires the machining, cutting and positioning of hard metallic materials such as brass and aluminum that further increase the fabrication time and costs.

Several techniques are also disclosed in U.S. Pat. Nos. 4,129,839 issued to Galani, et al.; 4,386,324 issued to Schellenberg; 4,450,418 issued to Yu; and 4,639,694 issued to Seino, et al. Additional techniques of power combining are disclosed in W. Rotman, et al., "Wide-Angle Microwave Lens for Line Source Applications," *IEEE Transactions on Antennas and Propagation*, November 1963, pp. 623–632; M. D. Abouzahra, et al., "Use of Circular Sector Shaped Planar Circuits for Multiport Power Divider-Combiner Circuits," *IEEE MTT-S Digest*, 1988, pp. 661–664; E. Belohoubek, et al., "30-Way Radial Power Combiner for Miniature GaAs FET Power Amplifiers," *IEEE MTT-S Digest*, 1986, pp. 515–518; E. J. Wilkinson, "An N-Way Hybrid Power Divider," *IRE Transactions on Microwave Theory and Techniques*, January 1960, pp. 116–118; and D. Staiman, et al., "New Technique for Combining Solid-State Sources," IEEE *Journal of Solid-State Circuits*, Vol.SC-3, No. 3, September 1968, pp. 238–243.

While the prior art provides several methods and devices for power combining, these methods are inefficient due to coupling losses. The inefficiencies in power combining also limit the number of devices that may be combined and make them unsuitable for combining large numbers of devices. Additionally, the prior art devices offer limited power amplification abilities, have excessive coupling between elements and are expensive to fabricate.

Thus, there is a need for an apparatus and method that provides efficient microwave power dividing and combining at low cost.

DISCLOSURE OF INVENTION

The present invention overcomes the deficiencies of the prior art by providing an apparatus (10) for power combining and dividing with wide-angle microwave lenses. The divider/combiner (10) of the present invention provides a high number of coupling ports, improved phase matching, wider bandwidth and improved isolation between elements. The divider/combiner (10) of the present invention is also easier to fabricate than any device known in the art.

A preferred embodiment of the power divider/combiner (10) of the present invention comprises a preamplifier (12), a first lens (14), a plurality of amplifiers (16) and a second lens (18). The preamplifier (12) is coupled to receive a microwave source signal (20), and the output of the preamplifier (12) is coupled to an input of the first lens (14). The first lens (14) divides the signal received on the input into a plurality of signals of equal amplitude and phase. The first lens (14) is preferably a wide-angle microwave lens. The first lens (14) preferably has a plurality of outputs each coupled to an input of a respective one of the plurality of amplifiers (16). The plurality of amplifiers (16) each amplify a divided signal from the first lens (14) and the signals output by the amplifiers (16) are coupled to the inputs of the second lens (18). The second lens (18) has a plurality of inputs and combines the signals from the inputs into a single higher level signal at an output.

In the preferred embodiment, the first and second lenses (14, 18) are preferably fabricated in printed circuit board. The second lens (18) is substantially similar to the first lens (14) in structure. The lenses (14, 18) are preferably mounted on top of each other separated by a mounting block (26). The mounting block (26) preferably has a thickness the same as the length of the amplifiers (16) so that the amplifiers (16) may be mounted on the side of the mounting block (26) between the first and second lenses (14, 18). This advantageously reduces the amount of stripline required for interconnection and reduces coupling losses. In an alternate embodiment, a plurality of the divider/combiners (36, 38, 40, 42 and 44) of the present invention may also be combined for increased amplification. In the alternate embodiment, a single divider/combiner (34, 46) uses additional divider/combiners (36, 38, 40, 42 and 44) as amplifiers. This configuration offers significantly increased levels of power with a very compact design.

In a third embodiment of the present invention, the power divider/combiner (60) is constructed using waveguide technology. In the third embodiment, the divider/combiner (60) comprises: a top section (62), a central section (64), a bottom section (66) and a plurality of amplifier modules (68). The top section (62), central section (64), and bottom section (66) are mounted together to form a generally circular disc shape. Between the top section (62) and central section (64), a cavity forms the divider (70) for dividing the input signal into a plurality of smaller signals of equal amplitude and phase. Similarly, between the bottom section (66) and central section (64), a hollow acts as the combiner (72) that combines a plurality of signals of equal amplitude and phase into a larger signal. The plurality of amplifier modules (68) are mounted to the top section (62), central section (64), and bottom section (66). Each amplifier module (68) receives a divided signal from the divider (70), amplifies it and then outputs it to the combinet (72). Thus, the present invention provides a structure that is easy and inexpensive to manufacture, and also provides high efficiency power amplification.

BRIEF DESCRIPTION OF THE DRAWINGS

FIG. 3 is a diagram illustrating the optical operation of the lenses of the present invention;

FIG. 4 is an exploded perspective view of the preferred embodiment of the divider/combiner of the present invention;

FIG. 11A is a side plan view of a preferred embodiment for the amplifier module of the third embodiment of the present invention;

FIG. 11B is a top plan view of the preferred embodiment for the amplifier module of the third embodiment; and FIG. 11C is a cross-sectional side view of the preferred embodiment for the amplifier module of the third embodiment.

DETAILED DESCRIPTION OF THE PREFERRED EMBODIMENTS

Figure 1:
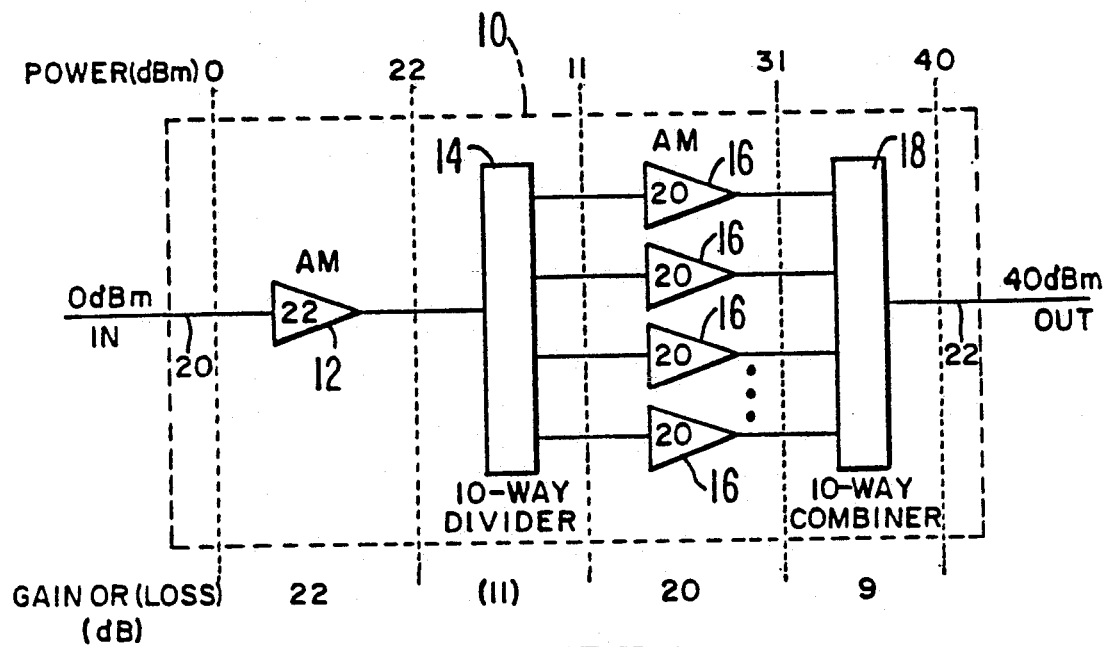
FIG. 1 is a block diagram of a preferred embodiment of the divider/combiner of the present invention.
Figure 2:
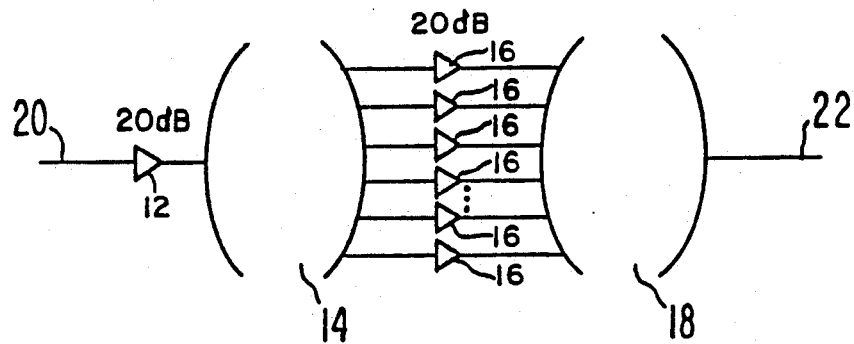
FIG. 2 is a schematic diagram of the preferred embodiment of the divider/combiner of the present invention.

Referring now to FIGS. 1 and 2, block and schematic diagrams for a microwave power divider/combiner 10 of the present invention are shown. The preferred embodiment of the divider/combiner 10 comprises a preamplifier 12, a dividing lens 14, a plurality of amplifiers 16, and a combining lens 18 to produce a 40 dB gain. The power divider/combiner 10 of the present invention receives a microwave source signal on an input 20. The divider/combiner 10 first amplifies the source signal with the preamplifier 12. Once amplified, the source signal is divided into a plurality of equal phase and amplitude signals by the dividing lens 14. Each of these equal phase and amplitude signals are further amplified by a respective amplifier 16. The signals output by the amplifiers 16 are then recombined into a single higher level signal by the combining lens 18 on an output 22.

As shown in FIG. 2, the input 20 is preferably formed from microstrip line. The preamplifer 12 has an input and an output, and is preferably a driver that provides 22 dB gain. The input of the preamplifer 12 is coupled to the microstrip line input 20 to receive the microwave source signal. The preamplifer 12 amplifies the microwave source signal and provides the amplified signal at its output.

The amplified signal provided by the preamplifer 12 is then sent to the dividing lens 14. The dividing lens 14 preferably uses one focal point (f1) of the lens 14 to receive the signal. The dividing lens 14 advantageously divides the signal from the preamplifier 12 into a plurality of equal phase and amplitude signals. In the exemplary embodiment of FIGS. 1 and 2, the amplified source signal is divided into 10 signals of equal phase and amplitude. The dividing lens 14 has 10 output lines to provide these signals. While the source signal is divided into 10 different signals, it should be understood that the dividing lens 14 and the combining lens 16 may respectively divide and combine any number of signals. As noted in FIG. 1, the use of the dividing lens 14 results in a loss of about 11 dB.

In the preferred embodiment, the dividing lens 14 is a microstrip patch Rotman lens as disclosed by W. Rotman et al., in "Wide-Angle Microwave Lens for Line Source Applications," *IEEE Transactions on Antennas and Propagation*, November 1963, pp. 623-632 (see Appendix A), which is hereby incorporated into this patent application by reference. The Rotman lens has traditionally been used as a mechanism for feeding linear array antennas. As shown in FIG. 3, the lens 14 provides two curved contoured surfaces shown at either side of the geometric shape that are designed such that there are three focal points (f1, f2 and f3) for the lens 14. The term "optical" is used here to describe the ray nature of the electromagnetic wave propagation in the quasi-parallel plate structure which supports transverse electromagnetic (TEM) wave propagation. The optical focusing nature of the lens 14 causes a plane electromagnetic wave arriving at normal incidence to induce equal amplitude and equal phase in each element 24. Due to the lens geometry, energy from the elements 24 will be summed at focal point f1. By reciprocity, any source placed at focal point f1 will induce signals of equal amplitude and phase at each element 24, thus radiating a wave emanating at a normal direction along the z-axis.

The other two focal points (f2, f3) act in the same way. Sources placed at either of these focal points (f2, f3) will radiate a field with a maximum radiation at an angle related to the displacement angle of the foci (with respect to the z-axis). And by reciprocity, a plane wave arriving at either of these two off-axis angles will converge at these same foci points (f2, f3).

The present invention takes advantage of these properties and uses the Rotman lens, with a slightly modified design as detailed below, as both a power divider and a power combiner. The present invention places two such modified lenses 14, 18 back to back and the device becomes the divider/combiner 10. By coupling the preamplifier 12 to enter the dividing lens 14 at focal point f1, the signal will be divided into a plurality of signals of equal amplitude and phase at the elements 24. Similarly, inputting signals through the elements 24 of the combining lens 18 will result in a single combined signal at the focal point f1.

As shown in FIGS. 1 and 2, each output of the dividing lens 14 is preferably coupled to the input of an individual amplifier 16. The amplifiers 16 are preferably constructed of microstrip, stripline or monolithic microwave integrated circuits (MMICs). The present invention provides a plurality of amplifiers 16 with one amplifier 16 dedicated to each signal output by the dividing lens 14. Each amplifier 16 amplifies a portion of the source signal that has been divided by the dividing lens 14. In the exemplary embodiment, the dividing lens 14 provides 10 output signals. Thus, 10 individual amplifiers 16 are needed, although only four are shown in FIGS. 1 and 2 by way of example. Each amplifier 16 preferably provides a 20 dB gain. The gain provided by the amplifiers may be changed according to the needs of the designer.

The outputs of the amplifiers 16 are coupled to inputs of the combining lens 18. The combining lens 18 preferably has a plurality of inputs equal in number to the outputs of the dividing lens 14. The combining lens 18 recombines the signals received at the inputs into a single signal with an increased power level. In the exemplary embodiment, the combining lens 18 combines the 10 signals from the 10 individual amplifiers 16 into a single signal. The output of the combining lens 18 is coupled to output 22.

As described above, the combining lens 18 is also a Rotman lens with a structure similar that of the dividing lens 14. In contrast to the dividing lens 14, the signals received from the amplifiers 16 are input to the combining lens 18 by coupling the outputs of the amplifiers 16 to elements 24 of a Rotman lens. The signals propagate through the lens 18, and the energy from the elements 24 is summed at focal point f1. The present invention advantageously provides for the coherent recombination of the signal at a level approximately equal to the preamplified source signal plus the amplifier gain provided by each of the amplifiers 16. The focal point f1 provides the output of the combining lens 18 and is coupled to microstrip output line 22. The power division and combination with the Rotman less provides improved efficiency and increased reliability over the prior art.

Figure 5:
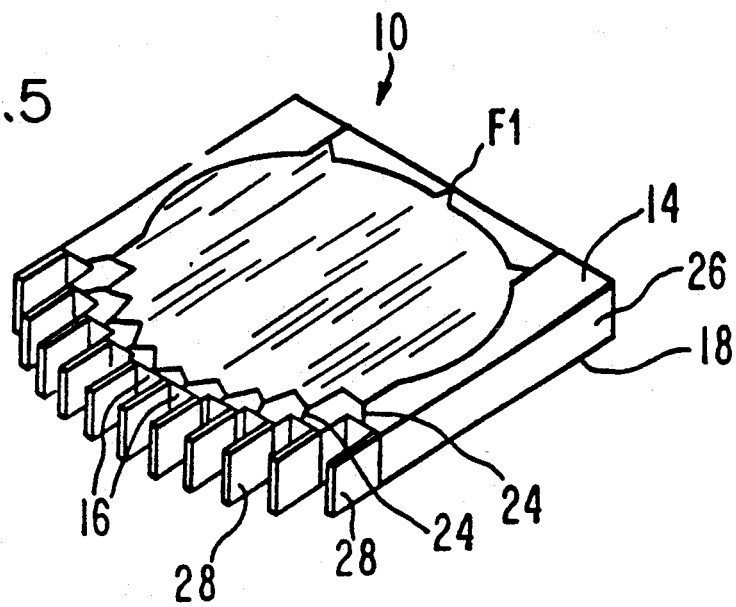
FIG. 5 is a perspective view of the preferred embodiment of the assembled divider/combiner of the present invention.

Referring now to FIGS. 4 and 5, perspective views of the preferred embodiment for the divider/combiner 10 of the present invention are shown. As noted above, the present invention uses two Rotman lenses whose conventional design is slightly modified for the dividing lens 14 and the combining lens 18. The lens shape and output constraining cables have a unique length as called for in the traditional Rotman design (See Appendix A). However, in the preferred embodiment, the lens body and the constraining elements are fabricated in printed circuit board using microstrip and/or stripline. The divider lens 14 and the combiner lens 18 can be identical Rotman microstrip printed circuit substrate boards, which significantly reduces fabrication costs. The lenses 14, 18 are preferably fabricated using 10 mil RT-Duroid 5880 material having a dielectric constant of about 2.53.

As best shown in FIG. 4, the present invention places the lenses 14, 18 stacked in a back-to-back configuration. This configuration provides improved efficiency, tighter phase control, denser packing and reduced fabrication costs. The dividing and combining lenses 14, 18 are mounted on the top and bottom, respectively, of a mounting block 26. The mounting block 26 is preferably constructed from a frame block of conducting material such as aluminum. The amplifiers 16 are located midway between the dividing lens 14 and the combining lens 18, attached on a side of the mounting block 26 proximate the outputs of the dividing lens 14 and the inputs of the combining lens 18. The amplifiers 16 are preferably microstrip amplifier modules. The amplifiers 16 are separated by cooling fins 28 that extend in a vertical direction away from the mounting block 26 for the removal of heat. In the preferred embodiment, the mounting block 26 is as thick as the length of the microstrip amplifier modules 16, and provides for easy interconnection to the elements 24 of the lenses 14, 18. This configuration advantageously eliminates the losses in the constraining lines connecting the lenses 14, 18 that can adversely affect the device's efficiency.

Figure 6:
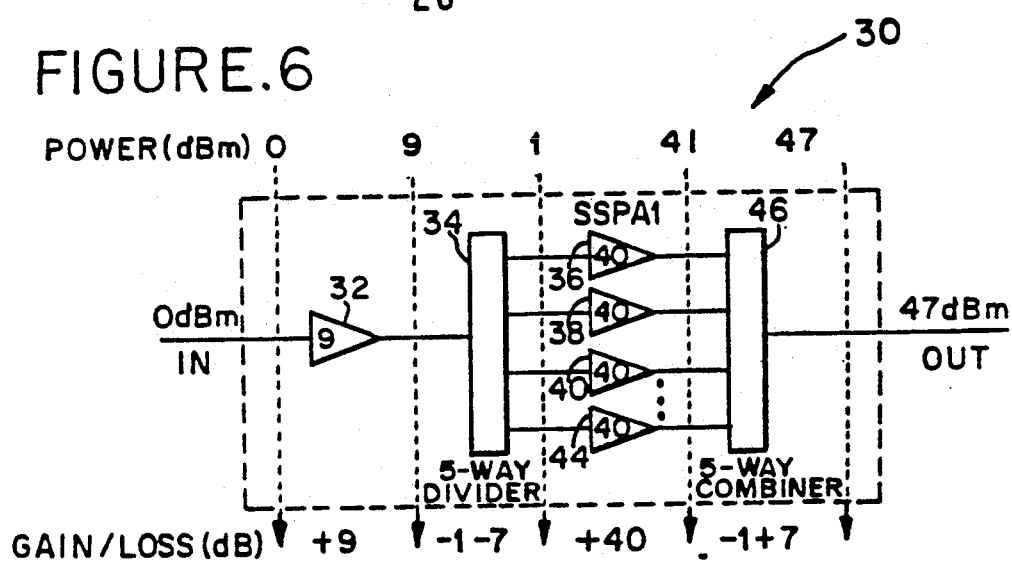
FIG. 6 is a block diagram of a second embodiment of the divider/combiner of the present invention.
Figure 7:
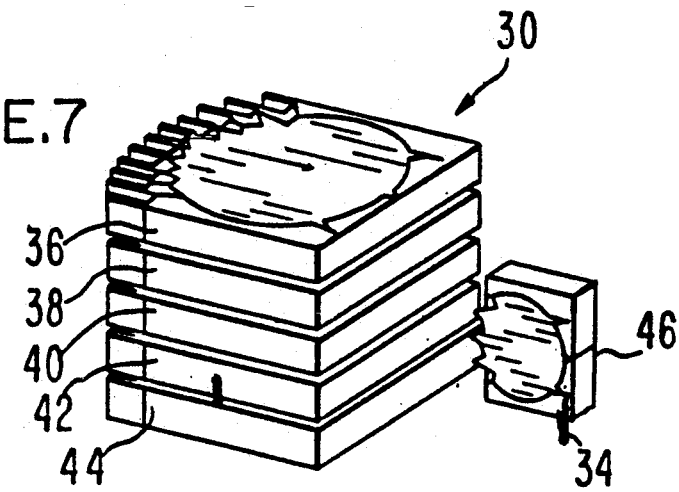
FIG. 7 is a perspective view of the second embodiment of the divider/combiner of the present invention.

Referring now to FIGS. 6 and 7, an alternate embodiment of the present invention is shown. The alternate embodiment illustrates the use of the present invention in an extended configuration where the output of a given lens assembly 34 serves as the input drive signal for N separate divider/combiner assemblies 36, 38, 40, 42 and 44 to yield significantly higher levels of power.

FIG. 6 shows a preferred embodiment for a 50 watt divider/combiner 30 with six divider/combiner assemblies. One divider/combiner assembly 34, 46 is used to divide and combine the source signal 20, while five divider/combiner assemblies 36, 38, 40, 42 and 44 are used as the individual amplifier elements for assembly 34, 46. The 50 watt divider/combiner 30 preferably comprises a preamplifier 32, a divider 34, a plurality of amplifiers 36, 38, 40, 42 and 44, and a combiner 46. The divider 34 and the combiner 46 are preferably modified Rotman lenses constructed in accordance with the present invention, and preferably have five elements 24. The coupling of these components is similar to the preferred embodiment, with the source signal first being amplified by the preamplifer 32. The output of the preamplifier 32 is then divided by the divider 34 into five signals of equal amplitude and phase. Next, the divided signals are output to a respective amplifier 36, 38, 40, 42 and 44. In this alternate embodiment, each amplifier 36, 38, 40, 42 and 44 is a separate divider/combiner, as described in the preferred embodiment, providing 40 dB gain. The outputs Of the amplifiers 36, 38, 40, 42 and 44 are then combined by the combiner 46 to output a single high level signal with about 50 dB gain from the source signal.

As shown in FIG. 6, the divider/combiner 10 of the present invention is advantageous because the amplifiers 36, 38, 40, 42 and 44 can be easily mounted in a compact configuration by stacking them on top of each other. Such a stacked configuration provides all the inputs and outputs of the amplifiers 36, 38, 40, 42 and 44 on one side of the stack. The divider 34 and combiner 46 are then mounted to the side of the stack for connection to each amplifier 36, 38, 40, 42 and 44. The divider 34 and combiner 46 can be coupled to the respective inputs and outputs of the amplifiers 36, 38, 40, 42 and 44 using stripline or microstrip (not shown). As shown in FIG. 7, the divider/combiner 34, 46 is somewhat smaller in size than the amplifiers 36, 38, 40, 42 and 44 because it divides and combines only from 1 to 5 or 5 to 1 signals, respectively. This embodiment is particularly advantageous because the coupling losses are significantly reduced since short connecting lines interconnect the amplifiers 36, 38, 40, 42 and 44, the divider 34 and the combiner 46.

Referring now to FIGS. 8–11, a third embodiment for the present invention will be described. In the third embodiment, the divider/combiner 60 is advantageously constructed using waveguide technology. In the third embodiment, the divider/combiner 60 preferably comprises: a top section 62, a central section 64, a bottom section 66 and a plurality of amplifier modules 68. The top section 62, central section 64, and bottom section 66 are preferably mounted together, on top of each other, and form the divider 70 between the top and central sections 62, 64, and the combiner 72 between the central and bottom sections 64, 66. The signal is received by an input port 74 formed by the top section 62 and the central section 64. The signal is then divided by the divider 70 into a plurality of signals of equal amplitude and phase at the divided ports 78. Each divided signal is then amplified with a respective amplifier module 68. The amplified signals are the input to the combiner 72 through the combining ports 80. The combiner 72 converts the signals into a single signal at the output port 76.

Figure 8:
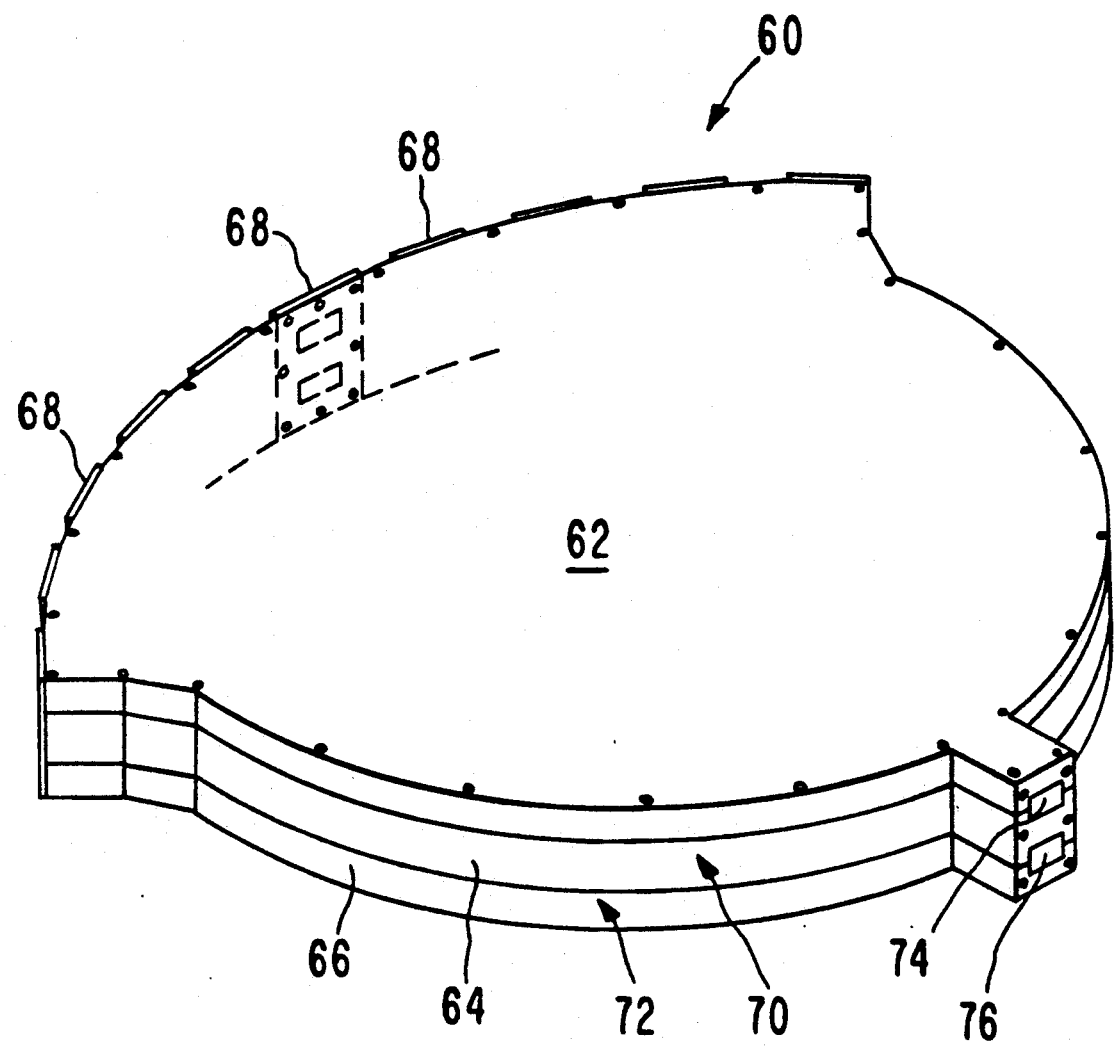
FIG. 8 is a perspective view of a third embodiment of the divider/combiner of the present invention.

Referring now to FIG. 8, a preferred embodiment for the divider/combiner 60 is shown. The divider/combiner 60 preferably has a flat substantially semi-circular disc shape. In the front of the divider/combiner 60, the input and output ports 74, 76 provide access to its interiors. As shown, the input port 74 is located directly above the output port 76. Each of the ports 74, 76 extends into the divider 70 and combinet 72, respectively, formed inside the divider/combiner 60. The area of the divider/combiner 60 increases from front to back to form a semi-circular shape. Along the rear side, the divider/combiner 60, further increases in area and has a convex shape. This shape advantageously provides an area on the rear of the divider/combiner 60 for mounting the amplifier modules 68. Along the rear of the divider/combiner 60, a plurality of ports 78, 80 are also provided. The number of dividing ports 78 and combining ports 80 are preferably equal. Each dividing port 78 is located above its corresponding combining port 80 similar to the input and output ports 74, 76. The pairs of ports 78, 80 are preferably spaced about the rear of the divider/combiner 60. In the preferred embodiment, there are a plurality of amplifier modules 68, equal in number to the number of divided signals, and the number of dividing and combining port 78, 80 pairs. For example, in FIG. 8, the divider/combiner 60 provides 10 amplifier modules 68. Those skilled in the art will realize that the number of amplifier modules 68 may vary according to the amplification desired.

Figure 9:
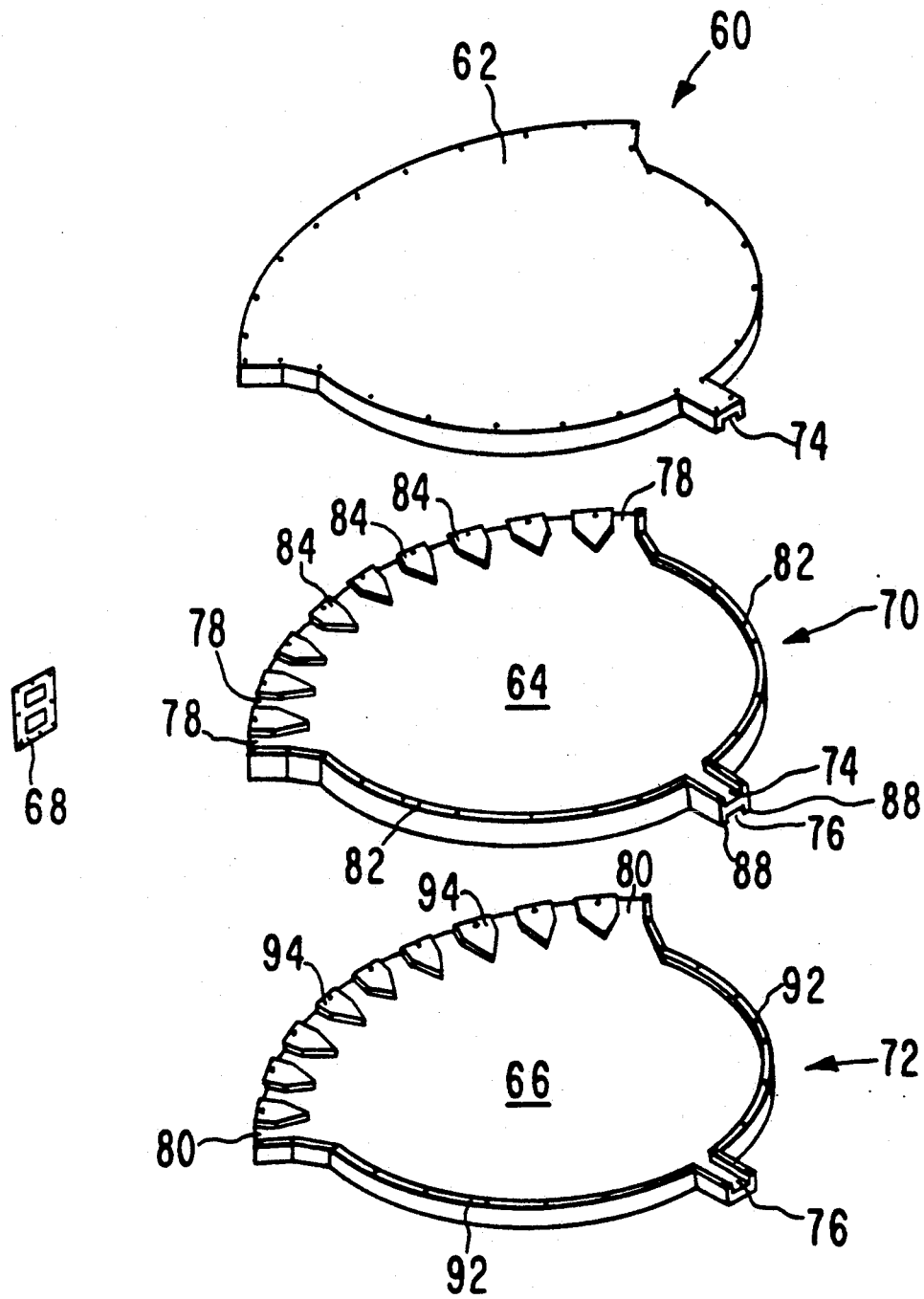
FIG. 9 is an exploded perspective view of the third embodiment of the divider/combiner of the present invention.

Referring now to FIG. 9, the divider/combiner 60 is shown in more detail. FIG. 9 is an exploded perspective view of the divider/combiner 60 that shows the top section 62, central section 64, and bottom section 66 in detail. Each section 62, 64, 66 preferably has a flat planar semi-circular shape as described above. As shown, the three sections 62, 64, 66 are mounted on top of each other with the central section 64 between the top and bottom sections 62, 66.

As seen in FIG. 9, the top of the central section 64 has walls 82 along both sides that extend upward to define a hollow in the top of the central section 64. The walls 82 also extend from the input port 74 near the front of the central section 64 to the dividing ports 78 proximate the rear of the central section 64. At the rear of the central section, there are also a plurality of partitions 84. The partitions define the dividing ports 78. The partitions 84 preferably extend to the same height as the walls 82, and have a substantially triangular shape. The partitions 84 are advantageously evenly spaced along the rear of the central section 64 to divide the input signal into a plurality of smaller signals equal in amplitude and phase. Similarly, the top section 62 has walls 86 along its sides and partitions 87 near its rear side. The walls 86 and partitions 87 are shaped like those of the central section 64. However, the walls 86 and partitions 87 of the top section 62 are mounted on the bottom of the top section 62 and extend downward to define a hollow on the bottom of the top section 62. The hollow in the top section 62 is preferably sized to match the size of the hollow in the central section 64. Thus, when the top and central sections 62, 64 are mounted together the divider 70 is formed. The divider 70 receives a signal at input port 74 and divides the signal into a plurality of signals of equal amplitude and phase that are output at the rear of the top and central sections 62, 64 through the dividing ports 78.

The central section 64 also has a pair of walls 88 and additional partitions 90 on the bottom. The walls 88 and partitions 90 preferably have the same shape as the walls 82 and partitions 84 on the top of the central section 64. However, as with the top section 62, these walls 88 and partitions 90 extend downward and form a hollow on the bottom of the central section 64. Corresponding to these walls 88 and partitions 90, the bottom section 66 provides matching walls 92 and partitions 94. The walls 92 and partitions 94 on the top of the bottom section 66 preferably have the same shape and placement, but on the bottom section 66, as the walls 82 and partitions 84 on the top of the central section 64. Thus, when the bottom section 66 and the central section 64 are mounted together, the output port 76 is formed at the front of the sections 64, 66; the combining ports are formed at the rear of the sections 64, 66; and the combiner 72 is formed between the sections 64, 66. Moreover, those skilled in the art will realize that the sections 62, 64, 66, walls 82, 86, 88, 92 and partitions 84, 87, 90, 94 can be constructed at low cost using electroforming or machining.

Figure 10:
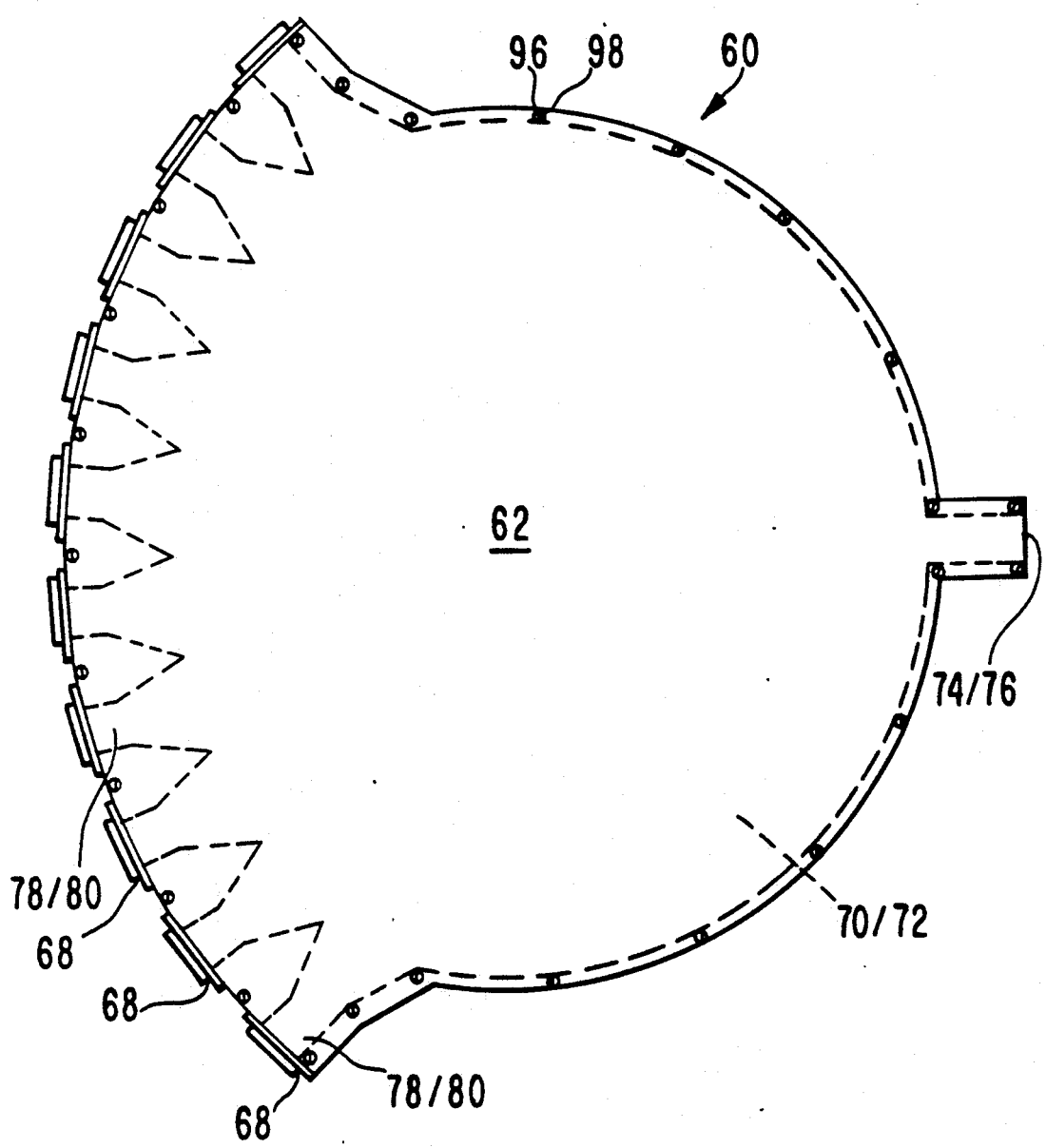
FIG. 10 is a top plan view of the third embodiment of the divider/combiner with the dividing and combining portions shown by dashed lines.

Referring now to FIG. 10, the ports 74, 76, 78, 80, the divider 70, and the combinet 72 are shown in more detail. FIG. 10 is a top plan view of the divider/combiner 60 of the present invention with the ports 74, 76, 78, 80, and divider 70 shown by dashed lines. As can be seen, the divider 70 and the combinet 72 are substantially circular shaped cavities. The signal enters through the input port 74 and then is output through the dividing ports 78, or conversely for the combiner 72. As shown, an amplifier module 68 is mounted to cover a dividing port 78 and a combining port 80 pair. FIG. 10 also illustrates how the three sections are mounted together. Each section 62, 64, 66 preferably has a plurality of holes 96 about its periphery. The holes 96 are positioned such that when the sections 62, 64, 66 are stacked together, the holes 96 in each section 62, 64, 66 align. Once stacked together, screws 98 are inserted in the holes 96 to secure the sections 62, 64, 66 together.

Referring now to FIGS. 11A, 11B and 11C, the preferred embodiment for the amplifier module 68 is shown. Each amplifier module 68 preferably comprises a housing 100, a cover 102, a platform 104 and an amplifier 106. FIG. 11A illustrates the amplifier module 68 from the rear with the cover 102 removed. As can be seen, the housing 100 has a rectangular shape with a pair of rectangular openings 107 extending therethrough. The rectangular openings 107 are advantageously sized to match the size of the combining and dividing ports 78, 80. The housing 100 also has a step-shaped exterior as shown in FIGS. 11B and 11C. The rear of the housing 100 is a rectangular shape, slightly smaller in size to define a step. Along the periphery and the first step, a plurality of holes 108 are provided for mounting the housing 100 to the top, central and bottom sections 62, 64, 66. The cover 102 is preferably a rectangular sheet sized to fit over the rear side of the housing 100.

As shown best by FIG. 11C, the housing provides a central bar 110 that separates the two rectangular openings. The central bar 110 preferably has a height slightly lower than the sides of the housing 100. The central bar 110 is sized to accomodate and hold the platform 104 and the amplifier 106. The platform 104 preferably extends beyond the central bar 110 into each of the rectangular openings as shown by FIG. 11C. The platform 104 preferably has stripline 112 on the rear side that is coupled to the input and output of the amplifier 106. The amplifier 106 preferably amplifies the input signal by a factor of ten. Thus, signals enter the module 68 through one port 78, and pass through the stripline 112 that extends into the rectangular opening. Then the signals are amplified and output through the stripline 112 to the other rectangular opening and the combining port 80.

Having described the present invention with reference to specific embodiments, the above description is intended to illustrate the operation of the preferred embodiments and is not meant to limit the scope of the invention. The scope of the invention is to be delimited only by the following claims. From the above discussion, many variations will be apparent to one skilled in the art that would yet be encompassed by the true spirit and scope of the present invention. For example, the two off perfect axis foci points (f2, f3) may be utilized as input ports for separate frequency power amplifiers operating simultaneously with the on axis port (f1). This feature would provide for significant cost savings in systems having the need for multiple frequency high power sources.

What is claimed is:

1. An apparatus for amplifying a microwave source signal, said apparatus comprising:
   an input port for receiving and transmitting microwave signals;
   a divider having an input and a plurality of outputs for dividing a signal into a plurality of signals equal in amplitude and phase, the input of the divider coupled to the input port;
   a plurality of dividing ports, each of said dividing ports coupled to a respective output of the divider;
   a plurality of amplifier modules, each amplifier module having an input and an output, the input of each amplifier module coupled to a respective dividing port;
   a plurality of combining ports, each of said combining ports coupled to the output of a respective amplifier module;
   a combiner having a plurality of inputs and an output for combining a plurality of signals into a larger amplitude signal, each input of the combiner coupled to a respective combining port; and
   an output port for receiving and transmitting microwave signals, said output port coupled to the output of the combiner; wherein
   the divider and combiner are formed by a top section, a central section and a bottom section, the combiner being formed between the top section and the central section, the divider being formed between the central section and the bottom section, and wherein the top, central and bottom sections are aligned with respect to each other.

2. The apparatus of claim 1, wherein:
   the top section has walls and partitions extending downward from a bottom of the top section to define a hollow;
   the central section has walls and partitions extending from a bottom and a top of the central section to form hollows on the top and the bottom such that when the top section and the central section are mounted together, the hollow on the bottom of the top section and the hollow on the top of the central section form a waveguide divider; and
   the bottom section has walls and partitions extending upward from a top of the bottom section to define a hollow such that when the central section and the bottom section are mounted together, the hollow on the bottom of the central portion and the hollow on the top of the bottom section from a waveguide combiner.

3. The apparatus of claim 2, wherein the walls of the central section and the walls of the top section also form the input port.

4. The apparatus of claim 2, wherein the walls and partitions of the central section and the walls and partitions of the top section also form the plurality of dividing ports.

5. The apparatus of claim 2, wherein the partitions of the bottom, central, and top sections have a similar shape which is substantially triangular.

6. The apparatus of claim 2, wherein the walls of the central section and the walls of the bottom section also form the output port.

7. The apparats of. claim 2, wherein the walls and partitions of the central section and the walls and partitions of the bottom section also form the plurality of combining ports.

8. The apparatus of claim 1, wherein the top section, the central section, and the bottom section have a shape that is substantially planar and semi-circular.

9. An apparatus for amplifying a microwave source signal, said apparatus comprising:
   an input port for receiving and transmitting microwave signals;
   a divider having an input and a plurality of outputs for dividing a signal into a plurality of signals equal in amplitude and phase, the input of the divider coupled to the input port;

a plurality of dividing ports, each of said dividing ports coupled to a respective output of the divider;

a plurality of amplifier modules, each amplifier module having an input and an output, the input of each amplifier module coupled to a respective dividing port;

a plurality of combining ports, each of said combining ports coupled to the output of a respective amplifier module;

a combiner having a plurality of inputs and an output for combining a plurality of signals into a larger amplitude signal, each input of the combiner coupled to a respective combining port; and an output port for receiving and transmitting microwave signals, said output port coupled to the output of the combiner; wherein each amplifier module comprises:

a housing defining first and second openings, said first and second openings sized to match a dividing and a combining port, respectively, said housing also defining a seat;

a cover for enclosing the first and second openings, said cover sized to fit over a rear side of the housing; and an amplifier having an input and an output for receiving a signal, amplifying the signal, and outputting the amplified signal, the amplifier mounted on the seat of the housing.

10. The apparatus of claim 9, wherein each amplifier module further comprises: stripline and a platform, the stripline mounted on the platform along with the amplifier, the platform mounted on the seat of the housing such that a portion of the stripline extends into the first and second openings to receive and transmit microwave signals.

11. The apparatus of claim 9, wherein the amplifier has a gain of about 10.

12. An apparatus for amplifying a microwave source signal, said apparatus comprising:

a first microstrip patch Rotman lens having an input and a plurality of outputs for dividing a signal on said input into a plurality of equal phase and amplitude signals on said outputs, said input coupled to receive the microwave source signal;

a first plurality of amplifiers, each amplifier having an input and an output, the input of each amplifier coupled to a respective output of the first lens; and a second microstrip patch Rotman lens having a plurality of inputs and an output, for combining the signals received on said plurality of inputs into a combined signal on said output, each of said inputs coupled to the output of a respective amplifier;

wherein the first lens and the second lens comprises a lens body and constraining elements that are fabricated in printed circuit board.

13. An apparatus for amplifying a microwave source signal, said apparatus comprising:

a first microstrip patch Rotman lens having an input and a plurality of outputs for dividing a signal on said input into a plurality of equal phase and amplitude signals on said outputs, said input coupled to receive the microwave source signal;

a first plurality of amplifiers, each amplifier having an input and an output, the input of each amplifier coupled to a respective output of the first lens; and a second microstrip patch Rotman lens having a plurality of inputs and an output, for combining the signals received on said plurality of inputs into a combined signal on said output, each of said inputs coupled to the output of a respective amplifier;

wherein the first lens and the second lens comprise a lens body and constraining elements that are fabricated of microstrip and stripline.

14. An apparatus for amplifying a microwave source signal, said apparatus comprising:

a first microstrip patch Rotman lens having an input and a plurality of outputs for dividing a signal on said input into a plurality of equal phase and amplitude signals on said outputs, said input coupled to receive the microwave source signal;

a first plurality of amplifiers, each amplifier having an input and an output, the input of each amplifier coupled to a respective output of the first lens; and a second microstrip path Rotman lens having a plurality of inputs and an output, for combining the signals received on said plurality of inputs into a combined signal on said output, each of said inputs coupled to the output of a respective amplifier;

wherein the first lens and the second lens are positioned in parallel planes.

15. The apparatus of claim 14, wherein the first lens and the second lens are stacked on top of each other with the plurality of amplifiers being situated between the first lens and the second lens.

16. The apparatus of claim 15, further comprising an aluminum block positioned between the first lens and the second lens, the plurality of amplifiers being mounted on the aluminum block, the aluminum block having a thickness greater than that of each of the amplifiers.

17. The apparatus of claim 16, further comprising a plurality fins for removing heat from the amplifiers, said plurality of fins mounted to the aluminum block with each of the fins positioned between two adjacent amplifiers.

18. The apparatus of claim 14, wherein the amplifiers are constructed of microstrip and monolithic microwave integrated circuits (MMICs).

19. An apparatus for amplifying a microwave source signal, said apparatus comprising:

a first microstrip path Rotman lens having an input and a plurality of outputs for dividing a signal on said input into a plurality of equal phase and amplitude signals on said outputs, said input coupled to receive the microwave source signal;

a first plurality of amplifiers, each amplifier having an input and an output, the input of each amplifier coupled to a respective output of the first lens; and a second microstrip patch Rotman lens having a plurality of inputs and an output, for combining the signals received on said plurality of inputs into a combined signal on said output, each of said inputs coupled to the output of a respective amplifier;

wherein each amplifier comprises:

a dividing lens having an input and a plurality of outputs for dividing a signal on said input into a plurality of equal phase and amplitude signals on said output;

a second plurality of amplifiers, each amplifier in said second plurality of amplifiers having an input and an output, the input of each amplifier coupled to a respective output of the dividing lens; and a combining lens having a plurality of inputs and an output, for combining the signals received on said plurality of inputs into a combined signal on said output, each of said inputs coupled to the output of a respective amplifier in the second plurality of amplifiers.

20. The apparatus of claim 14, further comprising an additional amplifier having an input and an output, the input coupled to receive the microwave source signal and the output coupled to the input of the first lens.

21. The apparatus of claim 9 wherein said divider comprises a first microstrip patch Rotman lens; and
said combiner comprises a second microstrip patch Rotman lens.

* * * * *

UNITED STATES PATENT AND TRADEMARK OFFICE
CERTIFICATE OF CORRECTION

PATENT NO.   : 5,329,248
DATED        : July 12, 1994
INVENTOR(S)  : Jamaledian Izadian and Roy S. Brazil It is certified that error appears in the above-identified patent and that said Letters Patent is hereby corrected as shown below:

On the title page, (item 75) is corrected to add the second inventor: Roy S. Brazil, Albion, California.

Signed and Sealed this

Fourth Day of April, 1995

*Attest:*

BRUCE LEHMAN

*Attesting Officer*     *Commissioner of Patents and Trademarks*